(12) United States Patent
Reissig

(10) Patent No.: US 7,490,026 B2
(45) Date of Patent: Feb. 10, 2009

(54) METHOD FOR PROVIDING ERROR INFORMATION RELATING TO INCONSISTENCIES IN A SYSTEM OF DIFFERENTIAL EQUATIONS

(75) Inventor: Gunther Reissig, München (DE)

(73) Assignee: Infineon Technologies AG, Munich (DE)

( * ) Notice: Subject to any disclaimer, the term of this patent is extended or adjusted under 35 U.S.C. 154(b) by 463 days.

(21) Appl. No.: 10/723,642

(22) Filed: Nov. 26, 2003

(65) Prior Publication Data

US 2004/0133407 A1    Jul. 8, 2004

Related U.S. Application Data

(63) Continuation of application No. PCT/DE02/01878, filed on May 23, 2002.

(30) Foreign Application Priority Data

May 28, 2001   (DE)   ................. 101 26 018

(51) Int. Cl.
  *G06F 7/60*    (2006.01)
  *G06F 17/50*   (2006.01)
(52) U.S. Cl. ............................. 703/2; 703/14
(58) Field of Classification Search .......... 703/2, 703/14

See application file for complete search history.

(56) References Cited

U.S. PATENT DOCUMENTS

| 6,192,328 | B1 | 2/2001 | Kahlert et al. |
| 6,230,101 | B1 | 5/2001 | Wallis |
| 6,266,630 | B1 * | 7/2001 | Garcia-Sabiro et al. ....... 703/14 |

FOREIGN PATENT DOCUMENTS

| JP | 01307868 A | 12/1989 |
| JP | 09044473 A | 2/1997 |
| WO | 99/48030 | 9/1999 |

OTHER PUBLICATIONS

English Translation of IPER for PCT/DE02/01878, Sep. 8, 2003.*
Reissig, "Differential-Algebraic Equations and Impasse Points", IEEE Transactions on Circuits and Systems-I: Fundamental Theory and Applications, vol. 43, No. 2, Feb. 1996.*
Reissig et al, "Computing the Generic Index of the Circuit Equations of Linear Active Networks", IEEE International Symposium on Circuits and Systems, vol. 3, pp. 190-193, 1996.*
Reissig et al, "Singularities of Implicit Ordinary Differential Equations", IEEE International Symposium on Circuits and Systems, vol. 3, pp. 326-329, 1998.*

(Continued)

*Primary Examiner*—Zoila E. Cabrera
*Assistant Examiner*—Nithya Janakiraman
(74) *Attorney, Agent, or Firm*—Laurence A. Greenberg; Werner H. Stemer; Ralph E. Locher

(57) ABSTRACT

The method and the computer-related products provide for error information relating to inconsistencies in a system of differential equations that describes a technical system or a technical process.

6 Claims, 3 Drawing Sheets

$$f_1(x_1(t), x_2(t), x_3(t), \dot{x}_1(t), \dot{x}_2(t), \dot{x}_3(t), p_1, p_2, p_3) = x_1(t) - x_2(t) - x_3(t),$$

$$f_2(x_1(t), x_2(t), x_3(t), \dot{x}_1(t), \dot{x}_2(t), \dot{x}_3(t), p_1, p_2, p_3) = p_1 \cdot x_1(t) + p_2 \cdot x_3(t),$$

$$f_3(x_1(t), x_2(t), x_3(t), \dot{x}_1(t), \dot{x}_2(t), \dot{x}_3(t), p_1, p_2, p_3) = p_3 \cdot x_2(t) - p_2 \cdot x_3(t),$$

$$\underline{p} = \begin{pmatrix} p_1 \\ p_2 \\ p_3 \end{pmatrix}$$

OTHER PUBLICATIONS

Kumar et al, "State-Space Realizations of Linear Differential-Algebraic-Equation Systems with Control-Dependent State Space", IEEE Transactions on Automatic Control, vol. 41, No. 2, Feb. 1996.*

Chowdry, S. et al.: "Automatic Structure Analysis of Large Scale Differential Algebraic Systems", IEEE, 2001, pp. 798-803.

Unger, J. et al.: Structural Analysis of Differential-Algebraic Equation Systems-Theory and Applications, Computers chem.Engng., 1995, pp. 867-882.

Reissig, G. et al.: "Differential-Algebraic Equations of Index 1 May Have an Arbitrarily High Structural Index", Siam J. Sci. Comput., vol. 21, No. 6, 2000, pp. 1987-1990.

Lawler, E.: "Combinatorial Optimization, Networks and Matroids", Dover Publications, Inc., 1976, front page, iii, and pp. 192-195.

Duff, I. S. et al.: "On Algorithms for Obtaining a Maximum Transversal", ACM Transactions on Mathematical Software, vol. 7, No. 3, Sep. 1981, pp. 315-330.

Pantelides, C. C.: "The Consistent Initialization of Differential-Algebraic Systems", Siam. J. Sci. Stat. Comput., vol. 9, No. 2, Mar. 1988, pp. 213-231.

Reißig, G.: "Extension of the Normal Tree Method", International Journal of Circuit Theory and Applications, vol. 27, Revised Version, 1999, pp. 241-266.

Christen, E. et al.: "Analog and Mixed-Signal Modeling Using the VHDL-AMS Language", 36th Design Automation Conference, VHDL-AMS Tutorial, Jun. 21-25, 1999, pp. 1-198.

* cited by examiner $$f_1(x_1(t),x_2(t),x_3(t),\dot{x}_1(t),\dot{x}_2(t),\dot{x}_3(t),p_1,p_2,p_3)=x_1(t)-x_2(t)-x_3(t),$$
$$f_2(x_1(t),x_2(t),x_3(t),\dot{x}_1(t),\dot{x}_2(t),\dot{x}_3(t),p_1,p_2,p_3)=p_1\cdot x_1(t)+p_2\cdot x_3(t),$$
$$f_3(x_1(t),x_2(t),x_3(t),\dot{x}_1(t),\dot{x}_2(t),\dot{x}_3(t),p_1,p_2,p_3)=p_3\cdot x_2(t)-p_2\cdot x_3(t),$$

$$\underline{p} = \begin{pmatrix} p_1 \\ p_2 \\ p_3 \end{pmatrix}$$

FIG. 1

$$\underline{A} = \begin{pmatrix} * & * & * \\ * & 0 & * \\ 0 & * & * \end{pmatrix}$$

$$f_1(x_1(t), x_2(t), x_3(t), p_1, p_2, p_3) = x_1(t) - x_2(t) - x_3(t),$$
$$f_2(x_1(t), x_2(t), x_3(t), p_1, p_2, p_3) = p_2 \cdot x_3(t),$$
$$f_3(x_1(t), x_2(t), x_3(t), p_1, p_2, p_3) = -p_2 \cdot x_3(t),$$

$$\underline{p} = \begin{pmatrix} p_1 \\ p_2 \\ p_3 \end{pmatrix}$$

FIG. 3

$$\underline{\underline{A}} = \begin{pmatrix} * & * & * \\ 0 & 0 & * \\ 0 & 0 & * \end{pmatrix}$$

A row rank with the elements 2, 3 was found.

A column rank with the elements 1, 2 was found.

FIG. 5

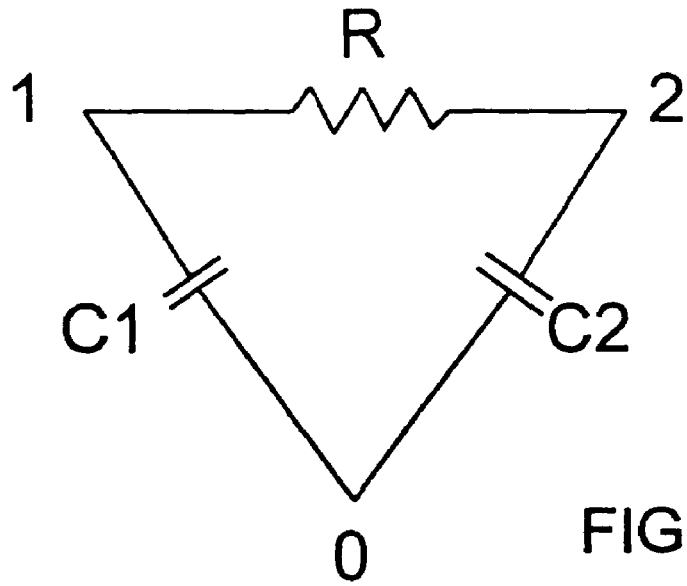

FIG. 6

G = ( "1: Kirchhoff voltage equation for the mesh comprising C1, R, C2"
"2: Kirchhoff current equation for the node 1",
"3: Kirchhoff current equation for the node 2")

K = ( "1: Voltage between nodes 1 and 0",
"2: Voltage between nodes 2 and 0",
"3: Voltage between nodes 1 and 2")

FIG. 7

A row rank having the elements
"2: Kirchhoff current equation for the node 1",
"3: Kirchhoff current equation for the node 2"
was found.

A column rank having the elements
"1: Voltage between nodes 1 and 0"
"2: Voltage between nodes 2 and 0"
was found.

FIG. 8

METHOD FOR PROVIDING ERROR INFORMATION RELATING TO INCONSISTENCIES IN A SYSTEM OF DIFFERENTIAL EQUATIONS

CROSS-REFERENCE TO RELATED APPLICATION

This application is a continuation of copending International Application No. PCT/DE02/01878, filed May 23, 2002, which designated the United States and which was not published in English.

BACKGROUND OF THE INVENTION

Field of the Invention

The invention relates to a method for providing error information relating to inconsistencies in a system of differential equations.

It is known in the prior art to describe a technical system with systems of differential equations. With the assistance of numerical methods using a computer system, or of an analog computer, it is possible to simulate the systems by calculating solutions to the systems of differential equations for specific initial or boundary conditions. Examples for the description of technical systems and typical simulation methods can be taken from standard works of the relevant field of specialization. Detailed instructions therefor are specified, for example, in G. Schmidt, "Grundlagen der Regelungstechnik" ["Principles of Control Engineering"], 2nd edition, Springer, Berlin, 1987, in Unbehauen, "Regelungstechnik I" ["Control Engineering I"], 6th edition, Friedr. Viehweg & Sohn, Braunschweig/Wiesbaden, 1989, in Unbehauen, "Regelungstechnik II" ["Control Engineering II"], 5th edition, Friedr. Viehweg & Sohn, Braunschweig/Wiesbaden, 1989, in Unbehauen, "Regelungstechnik III" ["Control Engineering III"], 2nd edition, Friedr. Viehweg & Sohn, Braunschweig/Wiesbaden, 1986, in E. Pfeiffer, "Einführung in die Dynamik" ["Introduction to Dynamics"], B. G. Teubner, Stuttgart, 1989, and in E. Ziegler (ed.), "Teubner-Taschenbuch der Mathematik" ["Teubner Manual of Mathematics"] B. G. Teubner, Stuttgart, 1996. When simulating, the problem frequently arises that a method for numerically solving a system of differential equations will terminate because the fundamental system of differential equations is singular. For the same reason, it can happen that an analog computer cannot foresee the system behavior. In addition, it frequently happens that solutions that are not plausible occur when solving the systems of differential equations.

In such a case, it is known in the prior art that the programmer or a user of a program for solving differential equations is responsible for locating errors. With extensive experience, it is possible to locate the causes of the singularity and, if appropriate, to reduce errors in the modeling of the technical system. This is generally very time consuming and costly.

A method for automatic structure analysis of very large systems of differential-algebraic equations is described in S. Chowdry et al: "Automatic structure analysis of large scale differential algebraic systems" IMTC 2001. Proceedings of the 18th IEEE Instrumentation and Measurement Technology Conference, Budapest, Hungary, May 21-23, 2001, IEEE Instrumentation and Measurement Technology Conference (IMTC): New York, N.Y.: IEEE, US, Vol. 1 of 3, Conf. 18, May 21, 2001 (2001-05-21), pages 798-803. This method takes account both of numerical and of symbolic information, and also incorporates the effects of linear terms rigorously into the mathematical system, and is capable of providing a very accurate representation of the structure of a system of differential-algebraic equations.

A structural algorithm that takes account of the structural properties of systems of differential-algebraic equations is described in the scientific article by J. Unger et al: "Structural analysis of differential-algebraic equation Systems—theory and applications" Comput. Chem. Eng.; Computers & Chemical Engineering August 1995, Pergamon Press Inc., Tarrytown, N.Y., USA, Vol. 19, No. 8, August 1995 (1995-08), pages 867-882. In that case, two systematically different structural approaches are implemented on a computer system in order to analyze systems of differential-algebraic equations structurally. These computer programs are applied both as separate programs for supporting the development of simulation models with a low index, and as constituents of the DIVA simulation environment, in order to facilitate a selection of suitable numerical algorithms, and to calculate consistent initial conditions.

The fact that the structural index of a linear differential-algebraic equation with constant coefficients and with the index 1 can be arbitrarily high and to that extent contradicts a result previously published in the literature is shown by the scientific publication by Gunter Reissig et al: "Differential-algebraic equations of index 1 may have an arbitrarily high structural index" Siam J. SCI. Comput.; Siam Journal of Scientific Computing 2000 SOC for Industrial & Applied Mathematics Publ., Philadelphia, Pa., USA, Vol. 21, No. 6, 2000, pages 1987-1990. This publication further states that when applied to differential-algebraic equations with an index of 1, Pantelides' algorithm can execute an arbitrarily high number of iterations and differentiations.

SUMMARY OF THE INVENTION

It is accordingly an object of the invention to provide a method for providing error information relating to inconsistencies in a system of differential equations which overcomes the above-mentioned disadvantages of the heretofore-known devices and methods of this general type.

With the foregoing and other objects in view there is provided, in accordance with the invention, a method for predicting the behavior of a technical system starting from prescribed system properties, boundary conditions, and/or starting from prescribed influences on the system. The method comprises the following steps:

providing a computer system;

defining a system of equations describing the technical system, the equations having the form $\underline{f}(t,\underline{x}(t),\underline{\dot{x}}(t),\ldots,\underline{x}^{(k)}(t),\underline{p})=\underline{0}$, and including:

$$f_1(t, \underline{x}(t), \underline{\dot{x}}(t), \ldots, \underline{x}^{(k)}(t), \underline{p}) = 0,$$

$$f_2(t, \underline{x}(t), \underline{\dot{x}}(t), \ldots, \underline{x}^{(k)}(t), \underline{p}) = 0,$$

$$\vdots$$

$$f_n(t, \underline{x}(t), \underline{\dot{x}}(t), \ldots, \underline{x}^{(k)}(t), \underline{p}) = 0,$$

wherein $\underline{x}(t)$ and derivatives $\underline{\dot{x}}(t), \ldots, \underline{x}^{(k)}$ thereof in each case have m elements, and $\underline{p}$ is a parameter vector that can occur in the system of equations; and executing a test method for providing error information relating to inconsistencies in the system of equations on the computer system, the test method having the following steps 1 to 3:

step 1: setting up a dependence matrix $\underline{\underline{A}}$ with m columns and n rows, and setting an element $\underline{\underline{A}}$ to $\underline{\underline{A}}(i, j) \neq 0$ when an $i^{th}$ row of $\underline{f}$ defined with $\underline{f}_i(t, \underline{x}(t), \underline{\dot{x}}(t), \ldots, \underline{x}^{(k)}(t),)$ is a function of
   a) a $j^{th}$ element of $\underline{x}$ expressed as $\underline{x}_j(t)$; or
   b) one of the derivatives of the $j^{th}$ element of $\underline{x}$ defined as $\underline{x}_j^{(s)}(t)$;

and otherwise setting the element $\underline{\underline{A}}(i,j)=0$;

step 2: determining a set of row ranks each having the numbers of those rows of the dependence matrix $\underline{\underline{A}}$ that are mutually dependent and determining a set of column ranks of the dependence matrix $\underline{\underline{A}}$ each having the numbers of those columns of the dependence matrix $\underline{\underline{A}}$ that are mutually dependent if such row ranks and/or column ranks are present; and step 3: outputting error information containing the numbers contained in each row rank determined in step 2 and in each column rank determined in step 2.

The invention is based on the idea of examining the system of differential equations for inconsistencies with the aid of combinatorial methods as early as before a simulation, that is to say before executing numerical calculating steps or building an analog computer. When information relating to such inconsistencies is at hand, it is possible to deduce errors in the modeling of the technical system, or errors in the technical system itself, that can cause undesired contamination in a later simulation step, or even render the system incapable of being simulated. There is no need for a time-consuming execution of the simulation as far as termination, nor for a trial simulation. The correction of the model of the technical system or of the technical system itself is substantially facilitated by the presence of information relating to inconsistencies.

The first step, of the method according to the invention, provides for setting up a dependence matrix $\underline{\underline{A}}$. The dependence matrix $\underline{\underline{A}}$ has exactly as many columns as the dimension of the solution vector $\underline{x}$ of the system of differential equations. The dependence matrix $\underline{\underline{A}}$ has exactly as many rows as the number of differential equations in the given system of differential equations.

The invention is not limited in this case only to systems of differential equations of the form $\underline{f}(t, \underline{x}(t), \underline{\dot{x}}(t), \ldots, \underline{x}^{(k)}(t), \underline{p}) = \underline{0}$. It can also be applied to special cases in which the system of equations for simulating the technical system has the form, for example, of $\underline{f}(t, \underline{x}(t)) = \underline{0}$. In such a case, the talk is not of a system of differential equations but of a generally nonlinear system of equations.

Moreover, it is not absolutely necessary for the system of differential equations that is provided for the simulation to be examined itself for inconsistencies. Moreover, another system of differential equations that describes the same technical system or the same technical process can be examined for inconsistencies. This can be advantageous when the last-named system of differential equations has a simpler structure than that to be simulated later. For example, in the simulation of electric networks the equations of modified node voltage analysis are usually the basis of the numerical simulation, although the so-called branch voltage-branch current equations have a substantially simpler structure. It is even possible frequently to determine more inconsistencies or to limit inconsistencies more severely by examining systems of differential equations with a simple structure.

The dependence matrix $\underline{\underline{A}}$ in this case has elements $\underline{\underline{A}}(i,j)$ that are set either to the value "zero" or to the value "nonzero", without regard to the absolute values of the elements of $\underline{\underline{A}}$. In this case, the element $\underline{\underline{A}}(i,j)$ can be set to a value $\neq 0$ when the $i^{th}$ row of $\underline{f}$ is a function of the $j^{th}$ element of $\underline{x}$, or of one of the derivatives of the $j^{th}$ element of $\underline{x}$. In all other cases, the element $\underline{\underline{A}}(i,j)$ is set to the value "0".

It is immaterial for the method according to the invention whether the dependence matrix $\underline{\underline{A}}$ is actually set up explicitly. Rather, what is important is the corresponding information as to whether the $i^{th}$ row of $\underline{f}$ is a function of the $i^{th}$ element of $\underline{x}$ or of one of its derivatives, or not, being available in the following method steps.

In the second step of the method according to the invention, a set of row ranks is determined that in each case have the numbers of those rows of the dependence matrix $\underline{\underline{A}}$ or those rows of the system of differential equations that are mutually dependent. Moreover, a set of column ranks of the dependence matrix $\underline{\underline{A}}$ is determined that in each case have the numbers of those columns of the dependence matrix $\underline{\underline{A}}$ or those components of $\underline{x}$ or one of its derivatives that are mutually dependent.

Here, "row rank" is understood as follows. A set $C_z$ of natural numbers i, $1 \leq i \leq n$, is a row rank of a matrix with n rows and m columns when it fulfils the following conditions:
   (i) there is no transversal T of the matrix $\underline{\underline{A}}$ such that $C_z$ is contained in the set of row indices of T.
   (ii) for each element c of $C_z$ there is a transversal T of $\underline{\underline{A}}$ such that $C_z \backslash \{c\}$ is wholly contained in the set of the row indices of T.

Here, the expression $C_z \backslash \{c\}$ represents that set which results when the element c is removed from the set $C_z$.

A transversal T of the matrix $\underline{\underline{A}}$ is understood as follows. A transversal of a matrix $\underline{\underline{A}}$ with n rows and m columns is one of, if appropriate, a plurality of possible sets of positions (i, j) of non-vanishing matrix entries $\underline{\underline{A}}(i, j)$, of which no two or more are in the same row or column. A set T of pairs (i, j), $1 \leq i \leq n$, $1 \leq j \leq m$, constitutes a transversal of the matrix $\underline{\underline{A}}$ if T fulfils the following conditions:
   (i) $\underline{\underline{A}}(i, j)$ does not vanish for all elements (i, j) of T, and
   (ii) given that (i, j) and (i', j') are two different elements of T, that is to say $i \neq i'$ or $j \neq j'$, it holds that $i \neq i'$ and at the same time $j \neq j'$.

It is of less importance for the invention in this case whether one of the possible transversals of the dependence matrix $\underline{\underline{A}}$ is calculated. The definition of the term "transversal" is required here, in order to illustrate the terms "row rank" and "column rank".

The term "row index of the transversal T" is understood as follows. The set Z of the "row indices of the transversal T" has as elements the row indices of the elements of T. In other words, this means that the set Z contains precisely those numbers i for which there is a j such that the element (i, j) is an element of T.

A column rank is understood as a set $C_s$ of natural numbers i, $1 \leq i \leq m$, of a matrix $\underline{\underline{A}}$ with n rows and m columns when it fulfils the following conditions:
   (i) there is no transversal T of the matrix $\underline{\underline{A}}$ such that $C_s$ is contained in the set of column indices of T.
   (ii) for each element c of $C_s$ there is a transversal T of the matrix $\underline{\underline{A}}$ such that $C_s \backslash \{c\}$ is wholly contained in the set of the column indices of T.

The "set of column indices of the transversal T" is understood as a set Z that contains as elements the column indices of the elements of the transversal T of the matrix $\underline{\underline{A}}$. In other words, this means that the set Z contains precisely those numbers j for which there is an i such that the element (i, j) is an element of the transversal T of the matrix $\underline{\underline{A}}$.

After step 2 according to the invention is carried out, there is present a set of row ranks that respectively have the numbers of those rows of the dependence matrix $\underline{\underline{A}}$ or those rows of the system of differential equations that are mutually dependent. Moreover, a set of column ranks of the dependence matrix $\underline{\underline{A}}$ is present that in each case have the numbers of those columns of the dependence matrix $\underline{\underline{A}}$ or of those components of $\underline{x}$ or one of its derivatives that are mutually dependent.

It is particularly easy having this information to deduce structural errors of the system of differential equations that is present as starting point. Such structural errors or inconsistencies in the original system of differential equations are frequently causes of errors in the calculation of the solution of the system of differential equations.

A basic step in executing the method according to the invention consists in finding row ranks and column ranks. Methods for finding row ranks and column ranks are known. Methods for determining "row ranks" are to be found in the literature under the keyword of "minimally structurally singular subsets of equations" (compare C. C. Pantelides, The consistent initialization of differential-algebraic systems in SIAM J. Sci. Statist. Comput., 9(2): 213-231, March 1988). In order to determine "column ranks", it is possible to use a method for determining "row ranks" when a transposed matrix is determined from that matrix of which the "column ranks" are to be determined. The row ranks of the corresponding transposed matrix are then determined in order to determine the column ranks of the matrix.

This manner of determining the row ranks and column ranks for the method according to the invention is not to be understood in a limiting way. Rather, it is also possible to use other methods to determine row ranks and column ranks if the remaining conditions for the presence of row ranks and column ranks are fulfilled.

In the concluding step of the method according to the invention, for each row rank and for each column rank that had been determined in accordance with step 2, the numbers that are contained therein are output. In the case of the row ranks, these numbers indicate the running numbers of the equations of the system of differential equations that are possibly affected by a structural problem. In the case of column ranks, the numbers contained therein and output as error information indicate the numbers of the components of the solution vector $\underline{x}$ that are possibly affected by a structural problem.

The method according to the invention can be used even before the execution of numerical calculating steps or the building of an analog computer to check the structure of the system of differential equations that is to be calculated for its consistency. If the method according to the invention had detected a system of differential equations as being inconsistent, it is possible to locate a large number of the possible structural errors of the system of differential equations. This accelerates the location of errors. In addition, time-consuming simulation tests are avoided.

The method according to the invention can be applied for any type of a simulation system for the numerical solution of systems of differential equations, and for the solution of systems of differential equations by means of an analog computer.

In a particularly advantageous development of the invention, before executing step 1 of the method according to the invention an equation significance list of length n is applied in which each equation of the system of equations is assigned an equation number and/or an item of equation text information. In exactly the same fashion, before executing step 1 of the method according to the invention, a component significance list of length m is applied in which each component of the solution vector $\underline{x}$ is assigned a component number and/or an item of component text information. In this case, the equation text information or component text information respectively stored in the significance list is advantageously selected such that this information acquires a significance in connection to the technical system to be simulated. Consequently, constituents of the simulated technical system and substructures of the technical system to be simulated can be assigned equations of the system of differential equations and components of the solution vector $\underline{x}$ that facilitate an interpretation of the error information output with the aid of the method according to the invention.

In step 3 of the method according to the invention, for this purpose it is provided to output the equation number and/or the item of equation text information in accordance with the equation significance list instead of outputting the numbers contained in each row rank. For the case in which a whole number i is contained in the row rank, it is not the number i that is output but rather the contents of the $i^{th}$ component of the equation significance list. In exactly the same fashion, in step 3 of the method according to the invention the component number and/or the item of component text information in accordance with the component significance list is/are output instead of outputting the numbers contained in each column rank. For the case in which the whole number j is present in the column rank as a number, it is not the number j that is output, but rather the contents of the $j^{th}$ component of the component significance list.

Owing to this refinement of the method according to the invention, significance contents that refer directly to the technical system to be simulated are output as error information. This error information can be used to illustrate with particular ease, systematic errors in the structure of the system of differential equations for describing the technical system, such that locating the errors is further accelerated.

In the method according to the invention a preferably digital computer is used that has at least a memory, an arithmetic unit, an input device, and an output device.

The invention is also implemented in a computer program for providing error information relating to inconsistencies in a system of equations. The computer program is designed in this case such that after inputting of the system properties, the initial or boundary conditions and the influences on the system, it is possible to execute an inventive method in accordance with one of the preceding claims. It is possible in this case to output results of a simulation, the solution vector or the solution vectors at different points in time. However, it is also possible for the computer program to provide only information relating to inconsistencies in accordance with one of the preceding claims.

Because numerous defective program runs and/or simulation trials can be avoided, the computer program according to the invention results in substantial improvements in run time by comparison with the known simulation programs and simulation methods.

Moreover, the invention relates to a data carrier with such a computer program, and to a method in which such a computer program is downloaded from an electronic data network, such as from the Internet onto a computer connected to the data network.

The computer system according to the invention is designed such that it is possible to execute on it a method according to the invention for providing error information relating to inconsistencies in a system of equations.

Finally, the invention also relates to the use of a method according to the invention and/or a computer system for providing error information relating to inconsistencies in a system of equations.

In the method according to the invention, the first step is to set up the system or system of differential equations that describes the process, or other forms such as, for example, nonlinear systems of equations that have no differential equations. It is assumed here, in this case, that the person skilled in the art is conversant with the mode of procedure required for this purpose. This is examined in detail in the specialist literature mentioned in the introduction to the description. There are also relevant computer programs for this purpose.

Other features which are considered as characteristic for the invention are set forth in the appended claims.

Although the invention is illustrated and described herein, in general, as embodied in a method for providing error information relating to inconsistencies in a system of differential equations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a set of functions and a parameter vector illustrating a first exemplary embodiment of the invention;

FIG. 2 is a matrix and a corresponding set of transversal elements;

FIG. 3 is a set of functions and a parameter vector describing a second exemplary system;

FIG. 4 is a matrix, a transversal, and column and row results;

FIG. 5 is an exemplary display of error results;

FIG. 6 is a schematic of an equivalent circuit;

FIG. 7 shows an equation significance list G and a component significance list K; and FIG. 8 is a resultant error list.

DESCRIPTION OF THE PREFERRED EMBODIMENTS

The first exemplary embodiment in accordance with the invention, relates to the simulation of a technical system that can be described by the numerical solution of the system of equations $$\underline{f}(t,\underline{x}(t),\underline{\dot{x}}(t),\ldots,\underline{x}^{(k)}(t),\underline{p})=\underline{0}$$

of the form $$f_1(x_1(t),x_2(t),x_3(t),\dot{x}_1(t),\dot{x}_2(t),\dot{x}_3(t),p_1,p_2,p_3)=0,$$

$$f_2(x_1(t),x_2(t),x_3(t),\dot{x}_1(t),\dot{x}_2(t),\dot{x}_3(t),p_1,p_2,p_3)=0,$$

$$f_3(x_1(t),x_2(t),x_3(t),\dot{x}_1(t),\dot{x}_2(t),\dot{x}_3(t),p_1,p_2,p_3)=0,$$

having the functions f1, f2 and f3, and having the parameter vector $\underline{p}$ in accordance with FIG. 1.

In order to predict the behavior of the system, the system of equations is solved numerically, that is to say values for the unknown vector $\underline{x}(t)$ are calculated at one or more points in time t. For this purpose, known methods of numerical solution are used which run as a computer program on a computer system.

According to the invention, steps for providing error information relating to inconsistencies in the system of equations are executed before the actual solution of the system of equations.

The dependence matrix $\underline{\underline{A}}$ specified in FIG. 2 is determined in step 1 of the method according to the invention, all non-vanishing elements of the dependence matrix $\underline{\underline{A}}$ being denoted in FIG. 2 by a star ("*")

The element $\underline{\underline{A}}(1,1)$ picked out by way of example is set to an essentially arbitrary non-vanishing value "*", because the first element of $\underline{f}$, that is to say $f_1(t,\underline{x}(t),\underline{\dot{x}}(t),\ldots,\underline{x}^{(k)}(t))$, is a function of the first element of $\underline{x}$, that is to say of $\underline{x}_1(t)$.

The element $\underline{\underline{A}}(1,3)$ picked out by way of example is set to the value "0", because the third element of $\underline{f}$, that is to say $f_3(t,\underline{x}(t),\underline{\dot{x}}(t),\ldots,\underline{x}^{(k)}(t))$, is independent of the first element of $\underline{x}$, that is to say of $\underline{x}_1(t)$ and of the derivatives of the first element of $\underline{x}$, that is to say $\underline{x}_1^{(S)}(t)$.

In step 2 of the method according to the invention, the first step is to determine the transversals T, specified in FIG. 2, of the dependence matrix $\underline{\underline{A}}$ with the aim of determining row ranks and column ranks of the dependence matrix $\underline{\underline{A}}$ specified in FIG. 2. Methods for determining transversals (of "maximum cardinality bipartite matchings") are specified in I. S. Duff, "On algorithms for obtaining a maximum transversal", ACM Trans. Math. Software, 7(3):315-330, 1981, in E. L. Lawler, "Combinatorial Optimization: Networks and Matroids", Holt, Rinehart and Winston, 1976, in L. Lovasz and M. D. Plummer, "Matching Theory", North-Holland Mathematics Studies 121. Annals of Discrete Mathematics, 29. North-Holland, 1986, or in C. C. Pantelides, "The consistent initialization of differential algebraic systems", SIAM J. Sci. Statist. Comput., 9(2):213-231, March 1988.

The transversal T from FIG. 2 has 3 elements. Since n=m=3, the dependence matrix $\underline{\underline{A}}$ from FIG. 2 has neither row ranks nor column ranks. No such row ranks of the dependence matrix $\underline{\underline{A}}$ are found by the method, specified in C. C. Pantelides "The consistent initialization of differential algebraic systems", for calculating row ranks ("minimally structurally singular subsets of equations"). The method specified there for calculating row ranks also finds no such row rank of the transpose of the dependence matrix $\underline{\underline{A}}$. It follows that there is no column rank of the dependence matrix $\underline{\underline{A}}$. The set, determined in step 2 of row ranks of the dependence matrix $\underline{\underline{A}}$ is empty. The set, determined in step 2 of column ranks of the dependence matrix $\underline{\underline{A}}$ is likewise empty. Consequently, no error information is output in step 3 of the method according to the invention.

The system of equations specified at the beginning can be solved with a higher probability without the occurrence of errors. If the simulation is terminated nevertheless, or if it supplies implausible solutions, or if it is entirely impossible, then it is possible to exclude structural errors in the description of the technical system or in the technical system itself with a high degree of probability. This substantially simplifies the location of errors.

The second exemplary embodiment in accordance with the invention relates to the simulation of a further technical system (not shown here), whose behavior can be described by the numerical solution of the system of equations $$\underline{f}(t,\underline{x}(t),\underline{\dot{x}}(t),\ldots,\underline{x}^{(k)}(t),\underline{p})=\underline{0},$$

of the form $$f_1(x_1(t),x_2(t),x_3(t),p_1,p_2,p_3)=0$$

$$f_2(x_1(t),x_2(t),x_3(t),p_1,p_2,p_3)=0$$

$$f_3(x_1(t),x_2(t),x_3(t),p_1,p_2,p_3)=0$$

having the functions f1, f2 and f3 and having the parameter vector $\underline{p}$ in accordance with FIG. 3.

It is aimed to solve the system of equations numerically in order to predict the behavior of the system, that is to say values are to be calculated for the unknown vector $\underline{x}(t)$ at one or more points in time t. Use is made for this purpose of known methods of numerical solution (not illustrated here) that run as a computer program on a computer system (not shown here).

According to the invention, methods for providing error information relating to inconsistencies in the system of equations are executed for the actual solution of the system of equations.

The dependence matrix $\underline{\underline{A}}$ specified in FIG. 4 is determined in step 1 of the method according to the invention, all non-vanishing elements of the dependence matrix $\underline{\underline{A}}$ being denoted by a star ("*") in FIG. 4.

The element $\underline{\underline{A}}(1,1)$ picked out by way of example is set to an essentially arbitrary non-vanishing value "*", because the first row of $\underline{f}$, that is to say $\underline{f}_1(t,\underline{x}(t), \underline{\dot{x}}(t), \ldots, \underline{x}^{(k)}(t))$, is a function of the first element of $\underline{x}$, that is to say of $\underline{x}_1(t)$. The same holds for the elements $\underline{\underline{A}}(1,2)$, $\underline{\underline{A}}(1,3)$, $\underline{\underline{A}}(2,3)$ and $\underline{\underline{A}}(3,3)$.

The element $\underline{\underline{A}}(3,1)$ picked out by way of example is set to the value "0", the third element of $\underline{f}$, that is to say $\underline{f}_3(t,\underline{x}(t),\underline{\dot{x}}(t), \ldots, \underline{x}^{(k)}(t))$, is independent of the first element of $\underline{x}$, that is to say of $\underline{x}_1(t)$ and of derivatives of the first element of $\underline{x}$, that is to say $\underline{x}_1^{(5)}(t)$. The same holds for the elements $\underline{\underline{A}}(2,1)$, $\underline{\underline{A}}(3,2)$ and $\underline{\underline{A}}(2,2)$.

In step 2 of the method according to the invention, the first step is to determine the transversals T, specified in FIG. 4, of the dependence matrix $\underline{\underline{A}}$ with the aim of determining row ranks and column ranks of the dependence matrix $\underline{\underline{A}}$ specified in FIG. 4.

The row rank {2, 3} of the dependence matrix $\underline{\underline{A}}$ is found by the method for calculating row ranks ("minimally structured singular subsets of equations") specified in C. C. Pantelides "The consistent initialization of differential algebraic systems". The set Z of the row ranks, found in step 2, of the dependence matrix $\underline{\underline{A}}$ is specified in FIG. 4.

The row rank {1, 2} of the transpose of the dependence matrix $\underline{\underline{A}}$ is found by the method, specified in C.C. Pantelides, "The consistent initialization of differential-algebraic systems", for calculating row ranks applied to the transpose of the dependence matrix $\underline{\underline{A}}$. According to the invention, this row rank of the transpose of the dependence matrix $\underline{\underline{A}}$ is understood as the column rank of the dependence matrix $\underline{\underline{A}}$. The set S of the column ranks, found in step 2, of the dependence matrix $\underline{\underline{A}}$ is specified in FIG. 4. The error information specified in FIG. 5 is output in step 3.

In accordance with the invention, there is not even an attempt to predict the behavior of the basic system using numerical means, because in this case errors will occur if a simulation is at all possible. However, the modeling of the system and the system itself need to be checked once again. This saves valuable computing time on the computer system (not shown here). Error locating is substantially simplified by the knowledge of the error information output in step 3.

A third exemplary embodiment in accordance with the invention relates to the technical system shown in FIG. 6, whose behavior can be described by the numerical solution of the system of equations $$\underline{f}(t, \underline{x}(t), \underline{\dot{x}}(t), \ldots, \underline{x}^{(k)}(t), \underline{p}) = \underline{0},$$

of the form $$f_1(x_1(t),x_2(t),x_3(t),p_1,p_2,p_3)=0$$

$$f_2(x_1(t),x_2(t),x_3(t),p_1,p_2,p_3)=0$$

$$f_3(x_1(t),x_2(t),x_3(t),p_1,p_2,p_3)=0$$

having the functions f1, f2 and f3 and having the parameter vector $\underline{p}$ in accordance with FIG. 3.

It is aimed to solve the system of equations numerically in order to predict the behavior of the system, that is to say values are to be calculated for the unknown vector $\underline{x}(t)$ at one or more points in time t. Use is made for this purpose of known methods of numerical solution that run as a computer program on a computer system.

Error information relating to inconsistencies in the relevant system of equations is provided in this case as follows according to the invention.

The solutions of the relevant system of equations are quiescent states or "operating points" or "DC solutions" of the electric network specified in FIG. 6 and which comprises the following network elements ("components"):

a linear resistor with resistance value R between the nodes 1 and 2 of the network, a linear capacitor with a capacitance C1 between the nodes 1 and 0 of the network, and a linear capacitor with a capacitance C2 between the nodes 2 and 0 of the network.

This results in the components of the parameter vector p, specified in FIG. 3, being according to the values C1, 1/R, C2.

The components x1(t), x2(t) and x3(t) of $\underline{x}(t)$ correspond to the following variables of the network specified in FIG. 6:

x1(t) corresponds to the voltage between the nodes 1 and 0, x2(t) corresponds to the voltage between the nodes 2 and 0, and x3(t) corresponds to the voltage between the nodes 1 and 2.

The first equation of the system of equations, that is to say, the equation $$f1(x1(t), x2(t), x3(t), p1, p2, p3)=0$$

is the Kirchhoff voltage equation for the mesh comprising all the three network elements of the network from FIG. 6.

The second equation of the system of equations, that is to say, the equation $$f2(x1(t), x2(t), x3(t), p1, p2, p3)=0$$

is the Kirchhoff current equation for the nodes 1 of the circuit in FIG. 6.

The third equation of the system of equations, that is to say, the equation $$f3(x1(t), x2(t), x3(t), p1, p2, p3)=0$$

is the Kirchhoff current equation for the nodes 2 of the circuit in FIG. 6.

The equation significance list G specified in FIG. 7 and the component significance list K specified in FIG. 7 are designed in accordance with the invention.

The set Z specified in FIG. 4, of the determined row ranks, and the set S, specified in FIG. 4 of the determined column ranks are determined as in the preceding exemplary embodiments.

The error information specified in FIG. 8 is output in step 3 of the method developed further in accordance with the invention, use being made of the equation significance list G and the component significance list K from FIG. 7.

It may be seen from the error information specified in FIG. 8 that the Kirchhoff current equations relating to the nodes 1 and 2 of the network from FIG. 6 are linearly dependent on one another, and that the two voltages between nodes 1 and 0 and between nodes 2 and 0 of the network from FIG. 6 for quiescent states of this network cannot be uniquely determined.

In accordance with the invention, there is not even an attempt to predict the behavior of the basic system using numerical means, because in this case errors will occur if a simulation is at all possible. However, the modeling of the system and the system itself need to be checked once again. This saves valuable computing time on the computer system. Error locating is substantially simplified by the knowledge of the error information output in step 3.

The term "computer-readable medium" as used herein should be understood in its broadest sense. That is, it includes, at the least, any kind of computer memory such as floppy disks, hard disks, CD-ROMS, flash ROMs, non-volatile and volatile ROM and RAM, and memory cards, as well as carrier signals for distance communication.

I claim:

1. A method for simulating an electrical network, whereby the inconsistencies in a system of differential equations of the electrical network are detected by the following steps:

providing a computer system including a memory, an arithmetic unit, an input device and an output device;

providing a system of equations describing the electrical network, the equations having the form $\underline{f}(t,\underline{x}(t), \underline{\dot{x}}(t), \ldots, \underline{x}^{(k)}(t),\underline{p})=\underline{0}$, including:

$$f_1(t, \underline{x}(t), \underline{\dot{x}}(t), \ldots, \underline{x}^{(k)}(t), \underline{p}) = 0,$$
$$f_2(t, \underline{x}(t), \underline{\dot{x}}(t), \ldots, \underline{x}^{(k)}(t), \underline{p}) = 0,$$
$$\vdots$$
$$f_n(t, \underline{x}(t), \underline{\dot{x}}(t), \ldots, \underline{x}^{(k)}(t), \underline{p}) = 0,$$

wherein $\underline{x}(t)$ and derivatives $\underline{\dot{x}}(t), \ldots, \underline{x}^{(k)}$ thereof in each case have m number of elements, and $\underline{p}$ is a parameter vector that can occur in the system of equations; and executing a test method for providing error information relating to inconsistencies in the system of equations on the computer system, the test method having the following steps 1 to 3:

step 1: setting up a dependence matrix $\underline{\underline{A}}$ with m number of columns and n number of rows, and setting an element $\underline{\underline{A}}$ to $\underline{\underline{A}}(i, j) \neq 0$ when an $i^{th}$ row of $\underline{f}(t,\underline{x}(t),\underline{\dot{x}}(t), \ldots, \underline{x}^{(k)}(t),\underline{p})$ defined with $\underline{f}_i(t,\underline{x}(t), \underline{\dot{x}}(t), \ldots, \underline{x}^{(k)}(t))$ is a function of a) a $j^{th}$ element of $\underline{x}$ expressed as $\underline{x}_j(t)$; or b) one of the derivatives of the $j^{th}$ element of $\underline{x}$ defined as $\underline{x}_j^{(s)}(t)$;

and otherwise setting the element $\underline{\underline{A}}(i, j)=0$;

step 2: determining a set of row ranks each having the numbers of those rows of the dependence matrix $\underline{\underline{A}}$ that are mutually dependent and determining a set of column ranks of the dependence matrix $\underline{\underline{A}}$ each having the numbers of those columns of the dependence matrix $\underline{\underline{A}}$ that are mutually dependent if such row ranks and/or column ranks are present; and step 3: outputting at the output device error information containing the numbers contained in each row rank determined in step 2 and in each column rank determined in step 2;

wherein the row rank includes a set $C_2$ of natural numbers i, where $1 \leq i \leq n$, of the matrix $\underline{\underline{A}}$ with the n number of rows and the m number of columns when it fulfils the conditions of:

i) no transversal T of the matrix $\underline{\underline{A}}$ such that $C_z$ is contained in the set of row indices of T, and ii) for each element c of $C_z$ there is a transversal T of the matrix $\underline{\underline{A}}$ such that $C_z\backslash\{c\}$ is wholly contained in the set of the row indices of T, and the column rank comprises a set $C_s$ of natural numbers i, where $1 \leq i \leq m$, of the matrix $\underline{\underline{A}}$ with the n number of rows and the m number of columns when it fulfils the conditions of:

i) no transversal T of the matrix $\underline{\underline{A}}$ such that $C_s$ is contained in the set of row indices of T, and ii) for each element c of $C_s$ there is a transversal T of the matrix $\underline{\underline{A}}$ such that $C_s\backslash\{c\}$ is wholly contained in the set of the column indices of T.

2. The method according to claim 1, which further comprises:

prior to executing step 1:

applying an equation significance list of length of the n number in which each equation of the system of equations is assigned at least one of an equation number and an item of equation text information; and applying a component significance list of length of the m number in which each component of a solution vector $\underline{x}$ is assigned at least one of a component number and an item of component text information;

in step 3, outputting at least one of the equation number and the item of equation text information in accordance with the equation significance list instead of outputting the numbers contained in each row rank; and in step 3, outputting at least one of the component number and the item of component text information in accordance with the component significance list instead of outputting the numbers contained in each column rank.

3. The method of claim 1, further comprising the step of downloading a computer program product or a computer program with computer-executable instructions for executing a method for numerical simulation of a technical system according to claim 1 from an electronic data network onto a computer connected to the data network.

4. The method according to claim 3, wherein the electronic data network is the Internet.

5. A computer program product for simulating an electrical network comprising a computer memory, including computer executable instructions to perform a method for providing error information relating to inconsistencies, whereby the inconsistencies in a system of differential equations of the electrical network are detected with the aid of a computer or with the aid of an analog computer and the system of equations is of the form $\underline{f}(t,\underline{x}(t), \underline{\dot{x}}(t), \ldots, \underline{x}^{(k)}(t), \underline{p})=\underline{0}$, including:

$$f_1(t, \underline{x}(t), \underline{\dot{x}}(t), \ldots, \underline{x}^{(k)}(t), \underline{p}) = 0,$$
$$f_2(t, \underline{x}(t), \underline{\dot{x}}(t), \ldots, \underline{x}^{(k)}(t), \underline{p}) = \underline{0},$$
$$\vdots$$
$$f_n(t, \underline{x}(t), \underline{\dot{x}}(t), \ldots, \underline{x}^{(k)}(t), \underline{p}) = \underline{0},$$

where $\underline{x}(t)$ and derivatives $\underline{\dot{x}}(t), \ldots, \underline{x}^{(k)}(t)$ thereof respectively have m number of elements, and $\underline{p}$ is a parameter vector that can occur in the system of equations; and the method comprising the following steps:

step 1: setting up a dependence matrix $\underline{\underline{A}}$ with m number of columns and n number of rows, and setting an element $\underline{\underline{A}}$ to $\underline{\underline{A}}(i, j) \neq 0$ when an $i^{th}$ row of $\underline{f}(t,\underline{x}(t), \underline{\dot{x}}(t), \ldots, \underline{x}^{(k)}(t),p)$ defined with $\underline{f}_i(t,\underline{x}(t), \underline{\dot{x}}(t), \ldots, \underline{x}^{(k)})$ is a function of a) a $j^{th}$ element of $\underline{x}$ expressed as $\underline{x}_j(t)$; or b) one of the derivatives of the $j^{th}$ element of $\underline{x}$ defined as $\underline{x}_j^{(s)}(t)$;

and otherwise setting the element $\underline{\underline{A}}(i, j)=0$;

step 2: determining a set of row ranks each having numbers of those rows of the dependence matrix $\underline{\underline{A}}$ that are mutually dependent and determining a set of column ranks of the dependence matrix $\underline{\underline{A}}$ each having numbers of those columns of the dependence matrix $\underline{\underline{A}}$ that are mutually dependent if such row ranks and/or column ranks are present;

step 3: outputting error information containing the numbers contained in each row rank determined in step 2 and in each column rank determined in step 2; and the row rank includes a set $C_z$ of natural numbers i, where $1 \leq i \leq n$, of the matrix $\underline{\underline{A}}$ with the n number of rows and the m number of columns when it fulfils the conditions of:

i) no transversal T of the matrix $\underline{\underline{A}}$ such that $C_z$ is contained in the set of row indices of T, and ii) for each element c of $C_z$ there is a transversal T of the matrix A such that $C_z \backslash \{c\}$ is wholly contained in the set of the row indices of T, and the column rank comprises a set $C_s$ of natural numbers i, where $1 \leq i \leq m$, of the matrix $\underline{\underline{A}}$ with the n number of rows and the m number of columns when it fulfils the conditions of:

i) no transversal T of the matrix $\underline{\underline{A}}$ such that $C_s$ is contained in the set of row indices of T, and ii) for each element c of $C_s$ there is a transversal T of the matrix $\underline{\underline{A}}$ such that $C_s \backslash \{c\}$ is wholly contained in the set of the column indices of T.

6. The computer program product according to claim 5, wherein the method for providing error information relating to inconsistencies further comprises:

prior to executing step 1:
    applying an equation significance list of length of the n number in which each equation of the system of equations is assigned at least one of an equation number and an item of equation text information; and
    applying a component significance list of length of the m number in which each component of a solution vector $\underline{x}$ is assigned at least one of a component number and an item of component text information;

in step 3, outputting at least one of the equation number and the item of equation text information in accordance with the equation significance list instead of outputting the numbers contained in each row rank; and in step 3, outputting at least one of the component number and the item of component text information in accordance with the component significance list instead of outputting the numbers contained in each column rank.

* * * * *